United States Patent [19]

Schutz

[11] Patent Number: 5,444,298
[45] Date of Patent: Aug. 22, 1995

[54] VOLTAGE CONVERTING INTEGRATED CIRCUIT PACKAGE

[75] Inventor: Joseph D. Schutz, Portland, Oreg.

[73] Assignee: Intel Corporation, Santa Clara, Calif.

[21] Appl. No.: 307,021

[22] Filed: Sep. 13, 1994

Related U.S. Application Data

[63] Continuation of Ser. No. 13,576, Feb. 4, 1993, abandoned.

[51] Int. Cl.[6] .......................................... H01L 23/16
[52] U.S. Cl. .................................. 257/691; 257/723; 257/724
[58] Field of Search ................ 257/723, 724; 323/265, 323/273; 307/303, 264, 261, 296.1, 296.6

[56] References Cited

U.S. PATENT DOCUMENTS 5,089,768  2/1992  Saito ................................... 323/265
5,233,288  8/1993  Hosaka .............................. 323/273

Primary Examiner—Sara W. Crane
Assistant Examiner—S. V. Clark
Attorney, Agent, or Firm—Blakely, Sokoloff, Taylor & Zafman

[57] ABSTRACT

A voltage converting package for an integrated circuit. The package of the present invention has a voltage converting means for converting a first operating voltage supplied to the package into a second operating voltage which is utilized to power an integrated circuit contained within the package.

20 Claims, 3 Drawing Sheets

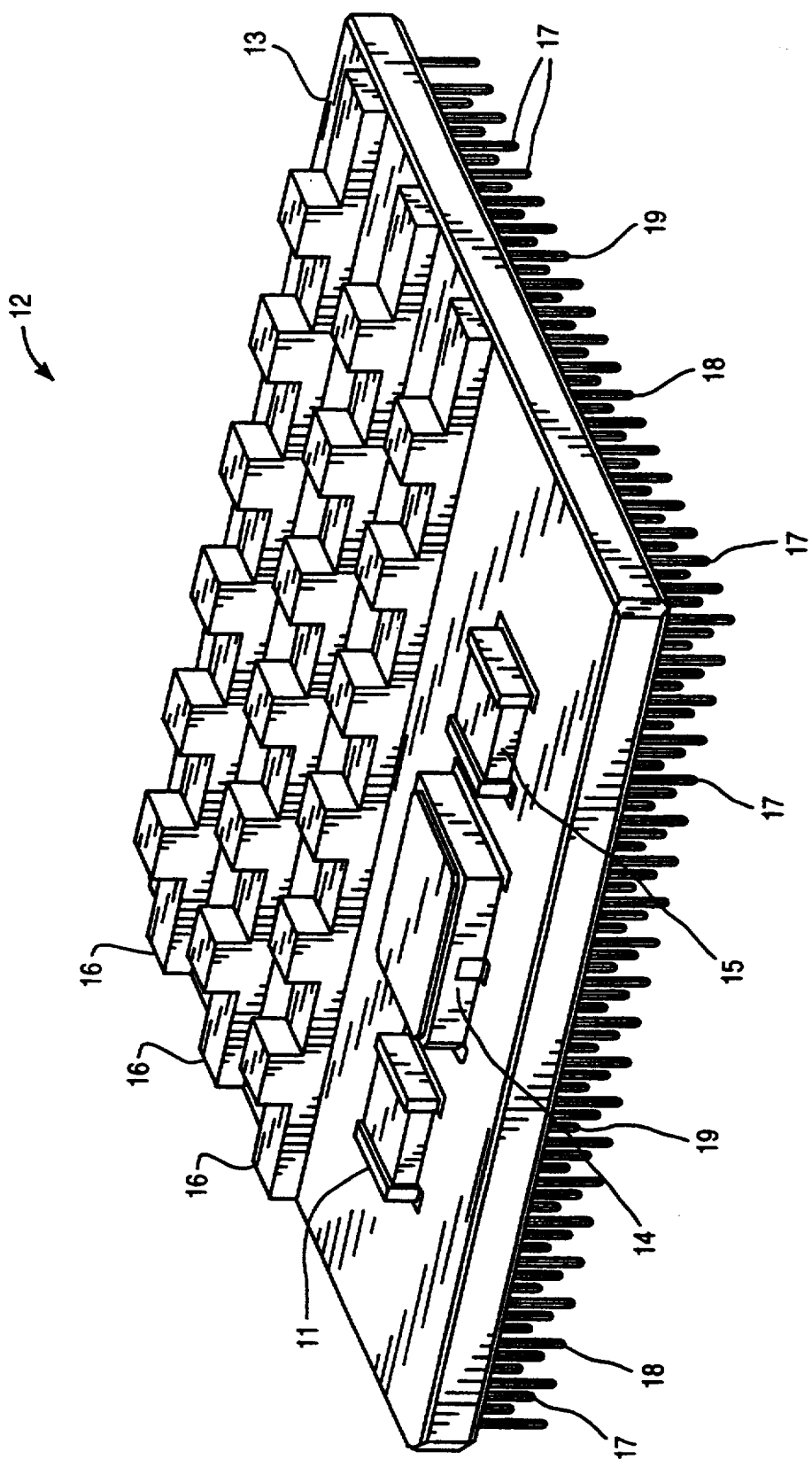
FIG_1

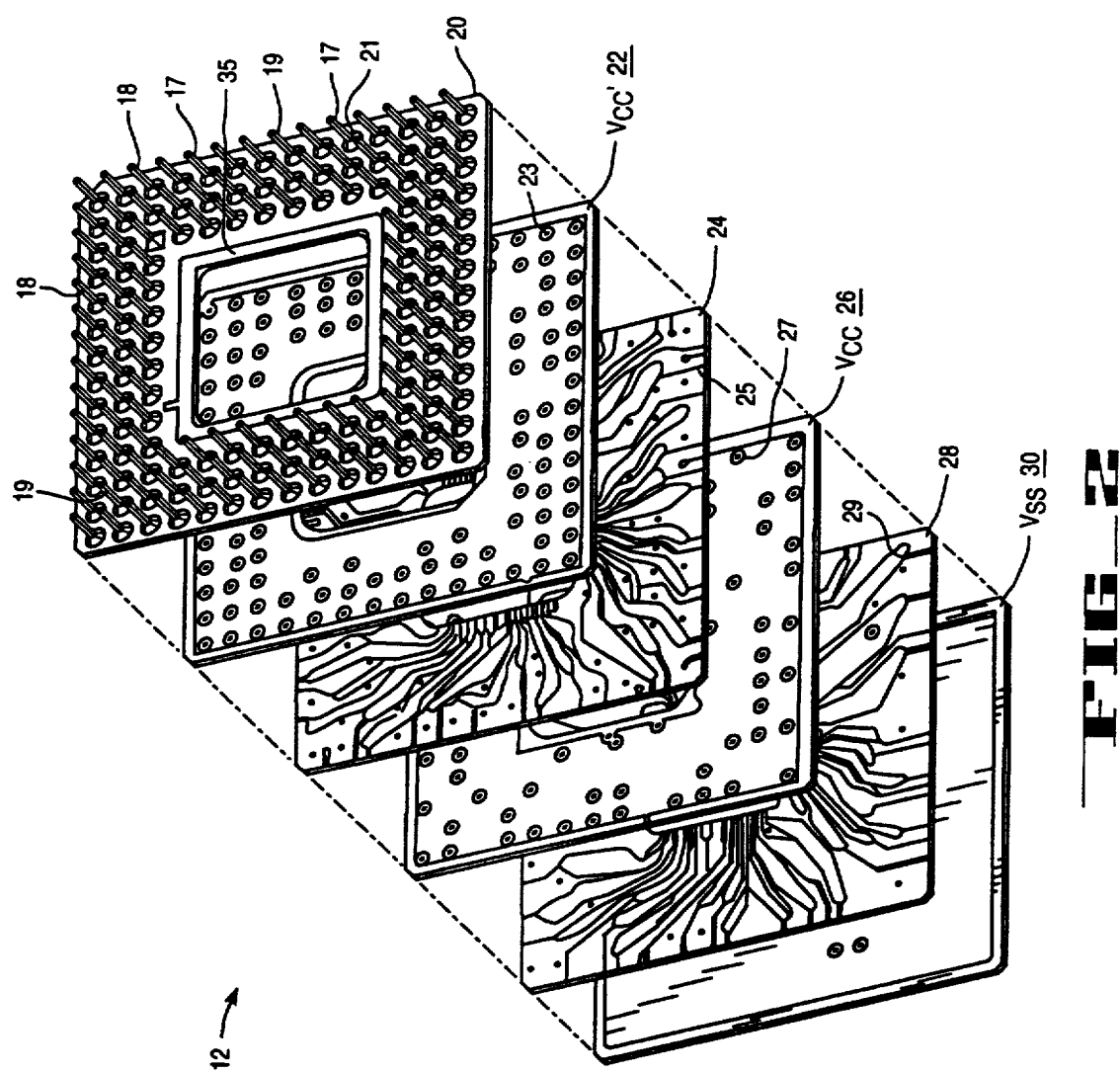
FIG_2

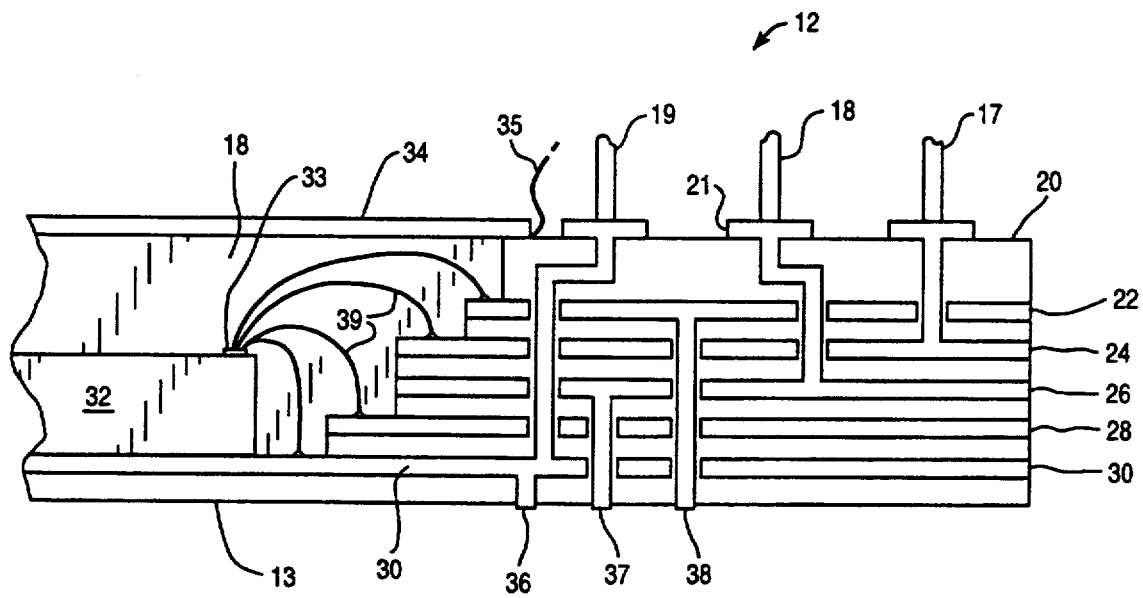
FIG_3
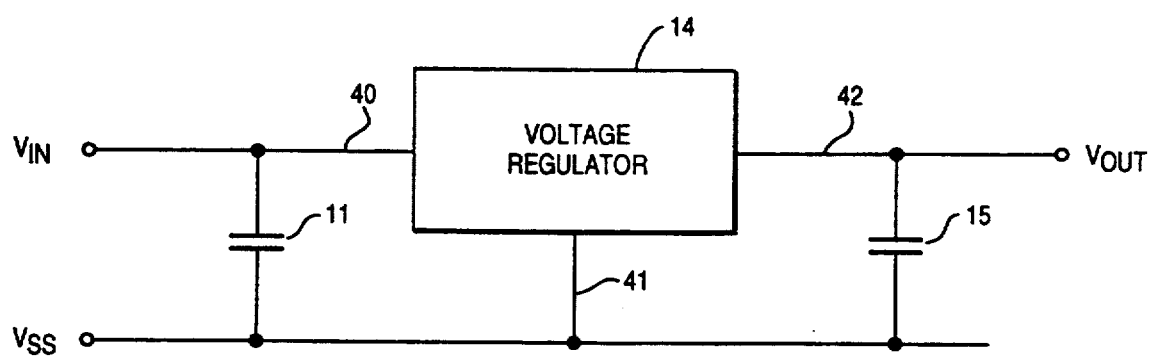
FIG_4

VOLTAGE CONVERTING INTEGRATED CIRCUIT PACKAGE

This is a continuation of application Ser. No. 08/013,576, filed Feb. 4, 1993, now abandoned.

BACKGROUND OF THE INVENTION

1. Field of the Invention

The present invention relates to the field of semiconductor packaging, and more specifically, to a semiconductor package which inputs a first power supply voltage from a mother board and converts the voltage into a second voltage which is used to power a semiconductor integrated circuit contained therein.

2. Description of Relevant Art

Integrated circuit packages come in a wide variety of shapes, sizes, and materials depending upon on the interconnection requirements of the specific circuit and system. The main function of integrated circuit packages is to provide for electrical connection of an integrated circuit to a printed circuit board, and to provide protection for the integrated circuit. Modern packages for the latest high density integrated circuits are very sophisticated and can contain up to several hundred leads or pins. The leads or pins provide means for supplying power and ground supplies to a chip contained in the package and for inputting and outputting signals representing data, addresses, and other information to and from the chip. Modern high density integrated circuits such as microprocessors and math co-processor chips are typically contained in ceramic pin grid arrays or multi-layer molded plastic packages.

Presently most integrated circuits operate at 5 volts $V_{CC}$. Present packages input 5 volts $V_{CC}$ from a power supply located on a circuit board and distribute this operating voltage to vadous locations on the chip. As integrated circuit fabrication techniques become more advanced, transistor dimensions are decreasing allowing for higher density and more complex circuits to be manufactured. These modern integrated circuits, however, will require a lower operating voltage of approximately 3.3 volts $V_{CC}$ instead of 5 volts $V_{CC}$, in order to prevent device failure or breakdowns. The lower operating voltage is also useful because less power is consumed by the integrated circuit. Future integrated circuits will be fabricated with 3.3 volt or lower processes as opposed to 5 volt processes.

Not only will future devices operate at approximately 3.3 volts $V_{CC}$, but present integrated circuits which now operate at 5 volts $V_{CC}$ will also eventually be made to operate at 3.3 volt $V_{CC}$. That is, for example, a present Intel ® 386 microprocessor which now operates at 5 volts $V_{CC}$ will eventually be fabricated with a process wherein it will operate at 3.3 volts $V_{CC}$ and not 5 volts $V_{CC}$. Present devices now fabricated with 5 volt processes will be fabricated with 3.3 volt processes because it is too expensive and difficult to run two different fabrication processes at a single facility. Moreover, a device made from a 3.3 volt fabrication process will eventually be cheaper to manufacture than a device made from a 5 volt fabrication process.

Unfortunately, however, there are many computer systems which are designed around chips that require 5 volts $V_{CC}$. These systems run the risk of becoming obsolete since they provide 5 volts $V_{CC}$ to the package containing the chip while eventually only chips which operate at 3.3 volts $V_{CC}$ will be available. A chip failure will result in the entire system becoming obsolete because these systems will not be able to obtain replacement chips which are compatible with their 5 volt electrical power distribution design.

Thus what is needed is an integrated circuit package which can receive 5 volts $V_{CC}$ from a circuit board but yet provide approximately 3.3 volts $V_{CC}$ to the integrated circuit contained therein.

SUMMARY OF THE INVENTION

A package for an integrated circuit which converts a supplied first operating voltage of approximately 5 volts $V_{CC}$ into a second operating voltage of approximately 3.3 volts $V_{CC}$, which is used to power an integrated circuit contained therein. The package has a three terminal voltage regulator, which has a first and second input and an output. The voltage regulator converts the first operating voltage into the second operating voltage. A first power supply plane which is coupled to at least one power supply lead is coupled to the first input of the voltage regulator. A power return lead or ground supply lead is coupled to a power return plane which in turn is coupled to the second input of the voltage regulator and to the integrated circuit. A second power supply plane is coupled to the output of the voltage regulator and to the integrated circuit. The second power supply plane provides power to the integrated circuit contained therein. A decoupling capacitor is usually connected in parallel between the output and the second input of the voltage regulator. The voltage regulator is placed on the top extedor of the package to aid in thermal performance. Heat sinks are also provided on the exterior of the package to aid with thermal dissipation.

A goal of the present invention is to provide a package which can receive a first operating voltage from a circuit board or other higher level packaging and convert the first operating voltage into a second operating voltage which is used to power the chip contained within the package.

Another goal of the present invention is to provide a package for an integrated circuit having an approximately 3.3 volt operating voltage wherein the package has the same "pinout" as a package for a functionally equivalent circuit which is powered with an approximately 5 volt operating voltage. The package converts the 5 volt operating voltage supplied to the package into a 3.3 volt operating voltage used to power the chip contained within the package.

Still another goal of the present invention is to provide a high density multi-layer package which exhibits excellent electrical performance characteristics.

Still yet another goal of the present invention is to provide a package which has a low output impedance and an improved transient response.

BRIEF DESCRIPTION OF THE DRAWINGS

FIG. 1 illustrates a multi-layer ceramic pin grid array of the present invention having a voltage regulator attached to the outer surface of the package.

FIG. 2 illustrates an exploded view of a multi-layer ceramic pin grid array of the present invention.

FIG. 3 illustrates a cross-sectional view of a multi-layer ceramic pin grid array of the present invention.

FIG. 4 illustrates a voltage converting means used in the present invention.

DESCRIPTION OF THE PREFERRED EMBODIMENT

The present invention describes a novel integrated circuit package which receives one operating voltage from a circuit board and converts it into a second operating voltage which is used to power the integrated circuit contained within the package. In the following description numerous specific details are set forth such as specific operating voltages and packaging materials etc. in order to provide a more thorough understanding of the present invention. It will be obvious, however, to one skilled in the art that the present invention may be practiced without these specific details. In other instances, well known packaging concepts and manufacturing methods have not been described in detail in order to not unnecessarily obscure the invention.

FIG. 1 shows the preferred embodiment of the present invention. FIG. 1 shows a multi-layer ceramic pin-grid array 12 having a cavity-down configuration. Attached to the outer surface 13 of the package 12 is a voltage regulator 14 for converting a first operating voltage supplied from a printed circuit board or other higher level packaging into a second operating voltage which is utilized by a semiconductor integrated circuit (not shown) contained within the package 12. Placing the voltage regulator on the exterior of the package helps thermal dissipation. Decoupling capacitor 15 is shown attached to the outer surface 13 of the package 12. The decoupling capacitor 15 reduces power distribution noise. A plurality of decoupling capacitors 11 can be used in some applications to improve $V_{CC}$ noise performance. A plurality of heat sinks 16 may also be applied to the outer surface 13 of the package 12 to help maintain the semiconductor integrated circuit within a reliable temperature range. A plurality of pins or leads 17, 18, and 19 provide for electrical interconnection of input-output signals, power supply lines and ground supply lines, respectively, to the package 12 from a printed circuit board.

It is to be appreciated that the plurality of pins 17, 18, 19 of package 12 are provided with the same "pinout" as a package for a funtionally equivalent semiconductor circuit which is designed to be powered at a different voltage. In this way package 12 can be simply plugged into a socket designed for a package of a functionally equivalent circuit but a circuit which is designed to operate at a higher voltage level. A pinout compatible version of the voltage converting integrated circuit package 12 of the present invention allows a modern integrated circuit which is designed to operate at a low voltage (approximately 3.3 volts in the preferred embodiment) to be utilized in a system designed for an integrated circuit which operates at a higher voltage level (approximately 5 volts in the preferred embodiment).

FIG. 2 shows an exploded view of the multi-layer pin grid array 12 of the present invention. The package 12 is fabricated with well-known multi-layer ceramic package manufacturing techniques. The package includes a ceramic brazing plane 20 where the I/O pins 17, power supply pins 18 and ground supply pins 19 are brazed with well known techniques to pin mounting pads 21.

Located below the brazing plane 20 is a first power supply plane 22. The power supply plane 22 provides the converted operating voltage $V_{CC'}$ (approximately 3.3 volts in the preferred embodiment) used to power the integrated circuit contained within package 12. Power plane $V_{CC'}$ 22 is coupled to the output of voltage regulator 14. The voltage regulator 14 converts the operating voltage of 5 volts supplied to the package 12 from a circuit board or system into an operating voltage $V_{CC'}$ (approximately 3.3 volts) used to power the integrated circuit. Power plane 22 is coupled by wire bonding to a plurality of power supply terminals located on the periphery of the chip. In this way the integrated circuit contained within package 12 is powered with approximately 3.3 volts $V_{CC'}$ as opposed to 5 volts $V_{CC}$ which is provided to the package. Power Supply plane 22 has a plurality of metal vias 23 contained therein so that the signal and power supply pins can make electrical connection to layers below.

Located beneath the $V_{CC'}$ power supply plane 22 is a first conductor layer or circuit layer 24. The first conductor layer 24 comprises a plurality of different conducting lines 25 which couple individual I/O signals such as data signals and address lines to the chip. That is, I/O signals that are provided to pin 17 propagate by way of metalized vias 23 through power plane 22 to respective metal lines 25 located on conductor layer 24. The metal lines 25 are then individually coupled by wire bonding or the like to respective terminals on the chip. The first conductive layer 24 also has a plurality of via connections formed therein.

Located beneath the first conductor layer 24 is a second power supply plane $V_{CC}$ 26. Power supply plane $V_{CC}$ 26 is coupled (by vias through power plane 22 and conductor layer 24) to respective $V_{CC}$ power supply pins 18 of package 12. The $V_{CC}$ power supply pins 18 provide the $V_{CC}$ power supply plane 26 with an operating voltage of 5 volts $V_{CC}$ from a pdnted circuit board to which the package 12 is connected. Power supply plane 26 has a plurality of via connections 27 contained therein in order to facilitate electrical connection between layers located above and below. It is to be appreciated that a $V_{CC}$ power plane 26 is not necessarily required in the present invention. The $V_{CC}$ power plane 26 provides performance advantages, but the additional layer increases package cost. What is necessary, however, is some means for coupling all the $V_{CC}$ power pins 18 together so that they can provide a single input to the voltage regulator. (For example, all $V_{CC}$ power pins 18 can be coupled together on first conductor layer 24.)

Located below $V_{CC}$ power supply plane 26 is a second conducting layer 28, comprising a plurality of metal lines 29. Metal lines 29, like the metal lines 25 on the first conducting layer 24, provide electrical interconnection from pins through vias to respective terminals on the periphery of the chip. The second conducting layer 28, like preceding layers, has via connections formed therein. Two conducting layers 24 and 28 are provided in the preferred embodiment of package 12 so that a large number of I/O pins 17 can be provided.

Located below the second conducting layer 28 is a metal ground supply ($V_{SS}$) plane or return power plane. The ground supply plane 30 is electrically coupled by well-known via connections techniques to ground supply pins 19. The ground plane removes the requirement for direct physical connection between ground supply terminals of the integrated circuit and their respective leads or pins 19. It also provides many beneficial electrical characteristics, such as reducing cross talk, and decreasing electrical inductance. Power planes are almost essential in modern high speed integrated circuit packages. An integrated circuit is bonded by well-known techniques onto ground supply plane 30 within cavity 18.

The integrated circuit package 12 of the present invention is manufactured by well known multi-layer ceramic technology. The individual layers described above are formed from green sheets (unfired alumina tape) wherein the conductor lines, power planes, and other metalization patterns are formed with a refractory metal such as tungsten, or equivalent, by screen-printing on the alumina green sheets layer by layer. Electrical connections are made from one layer to the next through via holes which are punched out of the green sheets and then filled with tungsten. All the green sheets are then laminated, stacked, and co-fired. The co-firing process turns the multi-layer stack of green sheets into a single monolithic ceramic body containing buried tungsten metalization. Metal parts such as I/O pins, and heat sinks, and seal rings are then attached using molten silver-copper euthic or pure silver brase. All exposed metal surfaces are then covered with the appropriate plating.

FIG. 3 is a cross-sectional illustration of package 12 of the present invention. An integrated circuit 32 is mounted by well-know techniques onto ground supply plane 30 within cavity 18. Power planes $V_{CC}$ 22 and $V_{SS}$ 30 and individual metal lines 25 and 29 of the first and second conductive layers 24 and 28 are individually wire-bonded to respective terminals 33 located around the periphery of the integrated circuit chip. The I/O pins 17, the $V_{CC}$ power supply pins 18, and the ground supply pins 19 are coupled through stacked vias to respective metal lines on the first and second conductive layers 24 and 28, and to power planes $V_{CC}$ 26 and $V_{SS}$ 30, respectively. A metal lid 34 is bonded by well-known techniques to a seal ring 35 surrounding cavity 18 located on brazing plane 20. The metal lid 34 hermetically seals the integrated circuit 32 within the package 12.

FIG. 3 shows a package 12 having a cavity-down configuration. The back of the integrated circuit 32 is mounted to the bottom layer (the $V_{SS}$ plane) of package 12. Subsequently formed layers have their interiors "cut out" so that they fit symmetrically around the integrated circuit 32. The dimensions of the removed portion increase with subsequently placed package layers so that a cavity 18 having a "pyramid" structure is formed. The "pyramid" structure facilitates wire bonding 39 of the individual layers to the integrated circuit 32. The package is said to be "cavity-down" because when the package is connected to a circuit board the cavity 18 faces down towards the circuit board. Such a "cavity-down" configuration exhibits excellent thermal characteristics.

Shown in FIG. 3 are three metalized via interconnects, 36, 37 and 38. Metalized vias 36, 37, and 38 provide electrical connection between voltage regulator 14 and ground plane 30, $V_{CC}$ power plane 26, and $V_{CC}$ power plane 22, respectively. The voltage regulator vias 36, 37, and 38 are formed with well-known multi-layer ceramic processing techniques. Although only three via interconnects are shown in FIG. 3, multiple interconnects may be provided. Additionally, although only five internal layers have been described, it is to be appreciated that additional layers may be provided. For example, additional layers may provide for further routing of I/O and power supply signals. Additional power supply planes such as $V_{CCP}$ and $V_{SSP}$ may also be provided. (For example, $V_{SSP}$ is a separate ground supply, $V_{SS}$, which is connected to a separate pin of the package. This pin is driven on the board with the same voltage level as $V_{SS}$.)

As shown in FIG. 1, a voltage regulator 14 is attached to the outer surface 13 of package 12. A simple three terminal regulator, shown in FIG. 4, is used in the present invention. The voltage regulator 14 receives a first input ($V_{in}$) 40 from $V_{CC}$ power plane 26 through via 37 and a second input $V_{SS}$ 41 from ground supply plane $V_{SS}$ 30 through via 36. Coupled between $V_{in}$ 40 and $V_{SS}$ 41 is a capacitor 11. Capacitor 11 provides decoupling and noise rejection.

The voltage regulator 14 outputs on output terminal $V_{OUT}$ 42 the voltage $V_{CC}$ which is approximately 3.3 volts in the preferred embodiment. Coupled between the output terminal 42 and $V_{SS}$ 41 is a decoupling capacitor 15. The decoupling capacitor 15 keeps the output impedance low and improves the transient response of the power supply. A decoupling capacitor is a shunt placed capacitance that is used to filter transients on a power distribution system. Although only a single capacitor 15 is shown, a plurality of parallel coupled capacitors may also be used. Additionally the decoupling capacitor may be provided internally to the package.

$V_{OUT}$ 42 of voltage regulator 14 is coupled to $V_{CC}$ power plane 22 through via 38. In this way $V_{CC}$ power plane 22 is supplied with an operating voltage of approximately 3.3 volts. $V_{CC}$ power plane 22 is then coupled by a plurality of wire bonds 39 to the power supply terminals of integrated circuit 32. In this way, the chip (or integrated circuit) 32 is provided with the required operating voltage of approximately 3.3 volts, while the package is provided with an operating voltage of approximately 5 volts.

The voltage regulator 14 is provided on the outer surface 13 of the package 12 in order to ensure good thermal conditions. A substantial amount of power is dissipated by the voltage regulator 14 and the integrated circuit 32. Although a three terminal voltage regulator is shown, and used in the preferred embodiment, it is to be appreciated that other voltage regulators and voltage converting circuits may be used. For example, diode drops or switching regulators may be used in place of voltage regulator 14. What is important is to use an appropriate circuit or device which can reliably provide the required voltage conversion and dissipate the heat associated with the resultant power dissipation.

As shown in FIG. 1, a plurality of heat fins or heat sinks 16 can be mounted on the exterior surface 13 of package 12. The heat sinks 16 are mounted with a thermal-conductive adhesive. The heat sink 16 essentially transfers dissipated heat from the enclosed IC and voltage regulator 14 to ambient air. The heat sinks 16 may be made from a wide variety of materials such as copper, molybdenum or beryllia (ceramics). It is to be appreciated that voltage regulator 14 and capacitors 11 and 15 are hermetically sealed in containers on the outer surface 13 of package 12.

It is to be stressed that with the present invention one can replace a 5 volt integrated circuit with a functionally equivalent 3.3 volt integrated circuit by simply popping out the 5 volt package and associated integrated circuit and replacing it with a pinout compatible voltage converting package having a functionally equivalent 3.3 volt integrated circuit contained therein. Although the present invention has been described with respect to a 3.3 v/5 v voltage converting package, it is to be appreciated that the scope of the present invention is not intended to be limited to these specific operating voltages.

Although the present invention has been described with respect to a multi-layer ceramic pin-grid array, it is to be appreciated that the teachings of the present invention are equally applicable to other types of packages or multi-chip modules. For example, the present invention can be implemented into a multi-layer molded plastic package such as described in U.S. Pat. No. 4,891,687 entitled: Multilayer Molded Plastic IC Package. An additional power plane would be incorporated to provide for a $V_{CC}$ plane. Additionally the present invention may be incorporated into a package manufactured with tape automated bonding (TAB) without departing from the intended scope of the present invention.

Thus, a novel integrated circuit package had been described which receives a first operating voltage from a mother board of a computer system and converts it into a second operating voltage which is used to power the integrated circuit contained within the package.

I claim;

1. An improved integrated circuit package of the type which interconnects an integrated circuit to a system wherein the package comprises:
   a power supply lead;
   a power return lead;
   a signal lead; and
   a voltage converter having an input coupled to said power supply lead and an output, said voltage converter for converting a first operating voltage supplied by said power suppy lead into a second operating voltage which is utilized to power said integrated circuit coupled to said output of said voltage converter, wherein said first operating voltage is a different voltage than said second operating voltage.

2. The package of claim 1 wherein said first operating voltage is approximately 5.0 volts and said second operating voltage is approximately 3.3 volts.

3. The package of claim 1 wherein said voltage converter is a voltage regulator.

4. The package of claim 1 further comprising:
   at least one decoupling capacitor coupled between a node providing said second operating voltage and a ground supply node.

5. The package of claim 1 further comprising:
   heat dissipating means for dissipating heat generated by said package.

6. The package of claim 1 wherein said package is a multi-layer ceramic pin grid array.

7. A package for an integrated circuit comprising:
   a plurality of leads for electrically coupling said package to a system, wherein at least one of said leads is a power supply lead for supplying a first operating voltage to said package supplied from said system and wherein at least one other lead is a power return lead;
   a first power supply plane electrically coupled to said power supply lead;
   a power return plane electrically coupled to said power return lead;
   a second power supply plane for providing a second operating voltage used to power an integrated circuit to be mounted in said package; and
   a voltage converter capable of converting said first operating voltage supplied by said power supply lead into said second operating voltage, said voltage converter having a first input electrically coupled to said first power supply plane and a second input electrically coupled to said power return plane and a first output electrically coupled to said second power supply plane.

8. The package of claim 7 wherein said first operating voltage is approximately 5.0 volts and said second operating voltage is approximately 3.3 volts.

9. The package of claim 7 wherein said voltage converter is a voltage regulator.

10. The package of claim 9 wherein said voltage regulator is a three terminal voltage regulator.

11. The package of claim 7 further comprising at least one decoupling capacitor coupled between said first output and said second input of said voltage converter.

12. The package of claim 7 further comprising heat dissipating means for dissipating heat generated by said package.

13. A package for an integrated circuit comprising:
   a plurality of leads for electrically coupling said package to a system, wherein at least one of said leads is a power supply lead for supplying a first operating voltage to said package, wherein at least one of said leads is a power return lead, and wherein at least one of said leads is a signal lead for inputing and outputing a signal to and from said package; and
   a voltage converter, said voltage converter for converting said first operating voltage supplied by said power supply lead into a second operating voltage, said voltage converter having a first input electrically coupled to said power supply lead and a second input electrically coupled to said power return lead, and a first output for providing a second operating voltage to be used wherein siad second operating voltage is different than said first operating voltage.

14. The package of claim 13 further comprising a first power supply plane electrically coupled between said power supply lead and said first input of said voltage converter.

15. The package of claim 13 further comprising a power return plane electrically coupled between said power return lead and said second input of said voltage converter, 16. The package of claim 13 further comprising a second power supply plane coupled to said first output of said voltage converter.

17. The package of claim 13 further comprising:
   at least two circuit layers wherein each circuit layer comprises a plurality of conductor lines wherein one of said plurality of conductor lines is coupled to said signal lead.

18. The package of claim 13 further comprising a decoupling capacitor coupled between said first output of said voltage converter and said power return lead.

19. The package of claim 13 further comprising a heat sink for dissipating heat from said package.

20. The package of claim 13 wherein said first operating voltage is approximately 5 volts and said second operating voltage is approximately 3.3 volts.

* * * * *

UNITED STATES PATENT AND TRADEMARK OFFICE
CERTIFICATE OF CORRECTION

PATENT NO.   :   5,444,298
DATED        :   August 22, 1995
INVENTOR(S)  :   Joseph D. Schutz It is certified that error appears in the above-identified patent and that said Letters Patent is hereby corrected as shown below:

In column 1 at line 37 delete "vadous" and insert --various--

In column 2 at line 32 delete "extedor" and insert --exterior--

In column 4 at line 34 delete "pdnted" and insert --printed--

Signed and Sealed this

Fifteenth Day of July, 1997

*Attest:*

BRUCE LEHMAN

*Attesting Officer*       *Commissioner of Patents and Trademarks*